(12) United States Patent
Yamada

(10) Patent No.: US 6,438,020 B1
(45) Date of Patent: Aug. 20, 2002

(54) FERROELECTRIC MEMORY DEVICE HAVING AN INTERNAL SUPPLY VOLTAGE, WHICH IS LOWER THAN THE EXTERNAL SUPPLY VOLTAGE, SUPPLIED TO THE MEMORY CELLS

(75) Inventor: Junichi Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 84 days.

(21) Appl. No.: 09/651,104

(22) Filed: Aug. 30, 2000

(30) Foreign Application Priority Data

Sep. 3, 1999 (JP) .......................................... 11-249916

(51) Int. Cl.[7] .............................................. G11C 11/22
(52) U.S. Cl. .................... 365/145; 365/149; 365/189.09
(58) Field of Search ................................. 365/145, 149, 365/189.09, 226, 230.06, 117

(56) References Cited

U.S. PATENT DOCUMENTS

| | | | | |
|---|---|---|---|---|
| 4,873,664 A | * | 10/1989 | Eaton, Jr. .................... | 365/145 |
| 5,309,399 A | | 5/1994 | Murotani | |
| 5,351,217 A | * | 9/1994 | Jeon ........................ | 365/230.06 |
| 5,406,510 A | * | 4/1995 | Mihara et al. ............... | 365/145 |
| 5,487,029 A | | 1/1996 | Kuroda | |
| 5,615,144 A | * | 3/1997 | Kimura et al. ............... | 365/145 |
| 5,910,911 A | * | 6/1999 | Sckiguchi et al. ........... | 365/145 |

FOREIGN PATENT DOCUMENTS

| | | |
|---|---|---|
| JP | 9-7376 | 1/1997 |
| JP | 9-92735 | 4/1997 |
| JP | 10-11976 | 1/1998 |
| JP | 10-289590 | 10/1998 |

OTHER PUBLICATIONS

J. Yamada et al., "A Self–Reference Read Scheme for a 1T/1C FeRAM", Symposium on VLSI Circuits Digest of Technical Papers, (1998), pp. 238–241 with Abstract.

* cited by examiner

Primary Examiner—Hoai Ho
Assistant Examiner—Gene N. Auduong
(74) Attorney, Agent, or Firm—Sughrue Mion, PLLC

(57) ABSTRACT

There is provided a highly reliable non-volatile ferroelectric memory device in which the permitted number of read/write operation cycles is increased. The device comprises a step-down power supply circuit which generates a supply voltage VINT which is lower than a supply voltage VDD fed from the outside but not less than a coercive voltage of the ferroelectrics for the purpose of improving the resistance to fatigue of and imprinting to the ferroelectrics. Since the characteristics of the ferroelectrics deteriorate more due to fatigue and imprinting as the voltage applied to the ferroelectrics increases, a supply voltage for sense amplifiers and voltage supply circuits are selected to be VINT so that VINT is applied to the ferroelectric capacitors, while a supply voltage for other peripheral circuits is selected to be VDD. With this structure, the reliability of the device with respect to its read/write operations can significantly be improved as compared to the conventional ferroelectric memory devices by minimizing the effect that the signal voltage is reduced and by increasing the permitted number of operation cycles.

13 Claims, 8 Drawing Sheets

FERROELECTRIC MEMORY DEVICE HAVING AN INTERNAL SUPPLY VOLTAGE, WHICH IS LOWER THAN THE EXTERNAL SUPPLY VOLTAGE, SUPPLIED TO THE MEMORY CELLS

BACKGROUND OF THE INVENTION

1. Field of the Invention

This invention relates generally to non-volatile semiconductor memory devices and more particularly to a ferroelectric memory device in which a ferroelectric material is used.

2. Description of the Related Art

The capacitance of a capacitor formed of a ferroelectric material (hereinafter referred to as "ferroelectric capacitance") exhibits hysteresis in the relation between an applied voltage and its polarization. A ferroelectric memory device which utilizes ferroelectric capacitors in its memory cells can retain data which have been written in the ferroelectric capacitors by applying voltages thereto by virtue of their residual polarizations even after the applied voltages become zero. Therefore, a non-volatile ferroelectric memory device can be constructed utilizing such characteristics.

During a reading operation in a ferroelectric memory device, stored data is reproduced by applying a voltage to a ferroelectric capacitor to cause a bit-line voltage, which corresponds to zeros or ones of the data stored in the data cell, to develop and then reading the bit-line differential voltage thus developed in accordance with the polarization direction by a sense amplifier. In order to carry out a correct reading operation with such a structure, it is important to make arrange for the difference between the bit-line differential voltage appearing when "0" is read and that appearing when "1" is read to be sufficiently large.

It is also important for stable reading operations to design the device so that a voltage applied during a writing operation is set to such a value that the polarization of the ferroelectric material is surely reversed.

There has been proposed, for example, in Japanese Unexamined Patent Application, First Publication No. 9-7376, a ferroelectric memory device which is controlled in such a way that a sufficiently large voltage is applied to the ferroelectrics during reading to obtain a sufficient difference between the bit-line differential voltages for reading "0" and "1", particularly for low-voltage operation of the device. This conventional control method and the structure of the device will now be described with reference to FIGS. 8 to 10.

In this conventional control method the pre-charge voltage of the bit lines is set, for the stable reading operation of the device, to a value which is higher than that of the supply voltage for the sense amplifiers and the peripheral circuits of the device.

In the case of a memory device where the pre-charge voltage for the bit lines is not stepped up, the voltage applied to the ferroelectric capacitor during a read operation is determined by the charge-sharing between the ferroelectric capacitance and the parasitic capacitance of the bit lines and is therefore lower than that applied thereto during a write operation. As a result, the read operation will not be stable.

In the ferroelectric memory device disclosed in Japanese Unexamined Patent Application, First Publication No. 9-7376, in order to realize a stable reading operation the pre-charge voltage applied during reading is selected to be higher, so that the voltage applied to the ferroelectric capacitance during reading is equivalent to that applied thereto during writing.

FIG. 8 shows the structure of the above conventional ferroelectric memory. As shown in FIG. 8, this memory comprises a step-down power supply circuit 804 provided for reducing the power consumption in a peripheral circuit 802. That is to say, the supply voltage to the peripheral circuit is a stepped-down supply voltage Vcc as obtained by lowering an external supply voltage Vhp fed from the outside.

On the other hand, bit lines BL0 and BL1 are pre-charged with a voltage higher than the stepped-down supply voltage Vcc, for example, with the external supply voltage Vhp fed from the outside. Specifically, a pre-charge circuit 803 is supplied with the external supply voltage Vhp.

FIG. 9 shows the structure of a circuit for the bit-line system of the conventional ferroelectric memory. A memory cell MC1 is comprised of two ferroelectric capacitors (capacitances) FC11 and FC12 and two cell transistors TC11 and TC12. One terminal of the ferroelectric capacitors FC11 and FC12 is connected in common to a plate line PL1 and the other terminal of the ferroelectric capacitors FC11 and FC12 is connected to the sources of the cell transistors TC11 and TC12, respectively. The gates of the cell transistors TC11 and TC12 are connected in common to a word line WL1 and the drains of the cell transistors TC11 and TC12 are connected to the bit lines BL0 and BL1, respectively. Other memory cells (MC2) than the memory cell MC1 have a circuit structure similar to that of the memory cell MC1 and their configuration and element sizes are equivalent to those of MC1.

With the above circuit structure, the potential of the plate line PL1 is fixed to a voltage equal to a half of the stepped-down supply voltage Vcc, i.e., Vcc/2.

A sense amplifier (SA) 801 is of the latch type and is constituted by first and second inverters whose input and output terminals are cross-coupled, wherein the first inverter is comprised of a P-channel MOS transistor PM1 and an N-channel MOS transistor NM1 connected between the terminals for sense-amplifier activation signals SAP and SAN and the second inverter is comprised of a P-channel MOS transistor PM2 and an N-channel MOS transistor NM2 connected between these terminals. The output terminal of the first inverter and the input terminal of the second inverter are connected to the bit line BL0, while the input terminal of the first inverter and the output terminal of the second inverter are connected to the bit line BL1.

P-channel MOS transistors PM3 and PM4, which are connected respectively between the bit lines BL0 and BL1 and a terminal for the supply voltage Vhp and have respective gates supplied with a pre-charge signal PBL, constitute the pre-charge circuit 803 which serves to pre-charge the bit lines when they are turned on.

The output terminals of the sense amplifier (SA) 801 are connected respectively to I/O lines IO0 and IO1 through column switches Y0 and Y1 whose ON/OFF states are controlled by a column selection signal YSW.

FIG. 10 is a time chart for the description of the operation of the circuits of FIG. 9 and shows each waveform of the signals on the word line WL1 and the plate line PL1, the pre-charge signal PBL, the signals on the bit lines BL0 and BL1 and the sense amplifier activation signals SAN and SAP. When the word line WL1 is brought to a high level during a read operation, voltages determined by the ratios of bit-line parasitic capacitances CB0 and CB1 to the capacitances of the ferroelectric capacitors are applied to these ferroelectric capacitors, whereby data is read out.

During a re-writing operation, since the voltage of the plate line PL1 is at Vcc/2, a voltage equal to Vcc/2 is applied across the terminals of each ferroelectric capacitor.

According to this conventional structure, the voltage applied to the ferroelectric capacitors during reading can be made equivalent to that applied thereto during writing by setting the pre-charge voltage of the bit lines to Vhp which is higher than the voltage Vcc for operating the peripheral circuit 802. A stable reading operation of the memory can thus be realized.

In the case where a reading operation is carried out with the voltage of the plate line being at Vcc or at the ground potential, since the voltages applied to the ferroelectrics are sufficient, the pre-charge voltage of the bit lines need not be increased and may be at the ground potential or Vcc.

FIG. 5 shows the hysteresis of the ferroelectrics. In FIG. 5, the abscissa represents the applied voltage and the ordinate represents the polarization (or charge Q). The hysteresis deteriorates in accordance with the fatigue of and the imprint on the ferroelectric film, which depend on the number of accesses to the memory cell, and further in accordance with the increase of the total time of retaining data. More specifically, a ferroelectric film of the memory cell, for which the hysteresis loop has repetitively been reversed, will have a reduced hysteresis loop due to fatigue.

FIG. 6 shows effects of the number of accesses to the ferroelectric capacitor on the bit-line voltage read therefrom due to the fatigue of the ferroelectric film. More specifically, in the case of reading "1" which accompanies a reversal of polarization, the read-out bit-line voltage decreases as the number of read operation cycles increases. In contrast, in the case of reading "0" which is an operation without a reversal of polarization, the read-out bit-line voltage does not much depend on the number of reading operation cycles and is substantially constant.

The ferroelectric memory disclosed in Japanese Unexamined Patent Application, First Publication No. 9-7376 and described above with reference to FIGS. 8 to 10 has the following problems.

A first problem is that the permitted number of operation cycles of the memory cell with ferroelectric capacitors will be decreased.

The reason for this is that no consideration has been given to the fact that the particular deterioration of characteristics such as the fatigue of the ferroelectric film and the imprinting depends on the applied voltage.

In general, the voltage applied to the ferroelectrics through a read/write cycle will be at a maximum when a write operation is performed. Thus, the voltage applied during a write operation will determine the permitted number of operation cycles of the ferroelectric capacitor. As will later be described, as the applied voltage is lowered the permitted number of operation cycles will increase, but the write operation will not be carried out correctly when the applied voltage is below the coercive voltage.

Thus, in the above-described conventional ferroelectric memory in which the pre-charge voltage is increased during reading, the pre-charge voltage Vhp of the bit-lines is always higher than the minimum write voltage and cannot be lower than that.

In addition, since a voltage equivalent to that applied during writing is applied to the ferroelectrics during reading, the allowable number of operation cycles is decreased due to fatigue and imprinting.

Furthermore, because of the necessity of increasing the bit-line pre-charge voltage, the effect of reducing the internal power consumption by the step-down power supply circuit is low.

A second problem is that the bit-line capacitances have not been optimized with respect to the characteristics of the ferroelectric capacitors.

The reason for this is that no consideration has been given to the fact that the signal voltage on the bit lines is determined by the relation between the capacitance of the ferroelectric capacitors and that of the bit lines. More specifically, a sufficient signal voltage can be obtained, without raising the bit-line pre-charge voltage, by selecting the optimum bit-line capacitance in accordance with the number of memory cells connected to the bit line.

When considering a stable operation which may be obtained by taking into consideration the deterioration of characteristics specific to the ferroelectrics such as the fatigue and imprinting, a stable read operation cannot be expected from the above-described conventional method. The conventional method rather leads to deterioration of the characteristics of the ferroelectrics and lowers the reliability due to its increased pre-charge voltage.

SUMMARY OF THE INVENTION

It is therefore an object of the present invention to provide a semiconductor memory device constructed using a ferroelectric material in which the permitted number of operation cycles is increased by solving the aforesaid first problem.

It is another object of the present invention to provide a ferroelectric memory device constructed using a ferroelectric material in which the permitted number of operation cycles is increased by solving the aforesaid second problem.

It is a further object of the present invention to provide a ferroelectric memory device having a read circuit of high reliability by solving the aforesaid first and second problems.

To achieve the above objects, a ferroelectric memory device according to the present invention comprises a memory cell array which comprises a plurality of memory cells arranged in rows and columns, each memory cell including a capacitor element formed by first and second capacitor electrodes with a ferroelectric film sandwiched therebetween for storing information in accordance with polarization states of said ferroelectric film and a transistor having a source and a drain, one of which is connected to one of the first and second capacitor electrodes of said capacitor element; a plurality of word lines provided for each row of the memory cell array and connected to gate of each transistor of memory cells included in the row; a plurality of plate lines connected to the other of the first and second capacitor electrodes of each of said capacitor elements in said plurality of memory cells; and a plurality of bit lines provided for each column of memory cell array and connected to the other of the source and the drain of each transistor of memory cells included in the column; a plurality of sense amplifiers connected to said bit lines; generating section for generating, from a first supply voltage fed from the outside, a second supply voltage which is lower than said first supply voltage; and supplying section for supplying said first and second electrodes of each capacitor element with said second supply voltage and the ground potential.

In the present invention, a voltage difference between the second supply voltage and the ground potential may be equal to or greater than a coercive voltage of the ferroelectrics of the ferroelectric film.

In the present invention, the voltage difference between the second supply voltage and the ground potential may correspond to a minimum voltage difference with which writing of information to and reading of information from the capacitor element can be achieved.

In the present invention, the generating section may comprise a step-down power supply circuit.

The present invention may comprise, as the supplying section, a plate-line voltage supply circuit, a word-line voltage supply circuit and a sense amplifier drive circuit, wherein the plate-line voltage supply circuit has a function of supplying the plate line with a voltage ranging from the ground potential to the second supply voltage, the word-line voltage supply circuit having a function of supplying each word line with a voltage ranging from the ground potential to a voltage which is at least a threshold voltage of the transistor in each memory cell higher than the second supply voltage and the sense amplifier drive circuit having a function of supplying the sense amplifiers with a voltage ranging from the ground potential to the second supply voltage.

According to the present invention, a supply voltage for the plate-line voltage supply circuit may correspond to a voltage difference between the second supply voltage and the ground potential.

According to the present invention, a supply voltage for the word-line voltage supply circuit may correspond to a voltage difference between the first supply voltage and the ground potential.

According to the present invention, the supply voltage for the word-line voltage supply circuit may correspond to a voltage difference between the second supply voltage and the ground potential.

According to the present invention, a supply voltage for the sense amplifier drive circuit may correspond to a voltage difference between the second supply voltage and the ground potential.

As described above, according to the present invention, the adverse effect that the signal voltage is decreased can be minimized and the permitted number of operation cycles can be increased. Thus, a ferroelectric memory device according to the invention has, amongst others, the advantageous effect that the reliability with respect to the read/write operation can significantly be improved as compared to the conventional ferroelectric memory devices.

The reason why the above advantageous effects can be obtained is that, taking into consideration the fact that the characteristics of the ferroelectrics deteriorate more as the voltage applied to the ferroelectric capacitors increases, the ferroelectric memory device according to the present invention is constructed such that an internal supply voltage, which is lower than the external supply voltage whose value is defined by the requirement of interfacing to the outside, is generated and supplied to the memory cells as their voltage.

DETAILED DESCRIPTION OF THE PREFERRED EMBODIMENTS

The preferred embodiments of the present invention will now be explained. In the course of the research which has matured into the present invention, it was found that the change of the read-out bit-line voltage due to the fatigue is dependent on the voltage applied to the ferroelectric capacitor in such a manner that the smaller the applied voltage the greater the number of operation cycles in which data can be read or written as shown, for example, in FIG. 6.

Reference will now be made, for example, to the experimentally manufactured chip of the ferroelectric memory device described in the proceedings of the 1998 Symposium of VLSI Circuits, on pages 238 to 241. According to this document, the experimental chip was designed with the conditions of 0.8 $\mu$m, CMOS process and 5 V supply voltage, and the number of possible operation cycles of the chip was on the order of $10^6$.

However, we have found in the above research that the characteristics of the device relating to the fatigue can further be improved by lowering the supply voltage.

Figure 6:
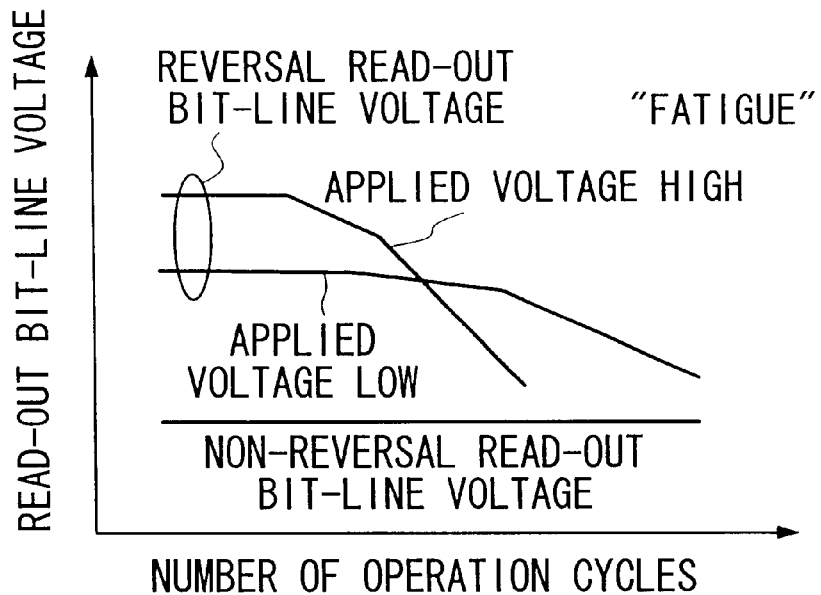
FIG. 6 is a graph showing the variation of the read-out bit-line voltage in accordance with the number of operation cycles for various cases.
Figure 7:
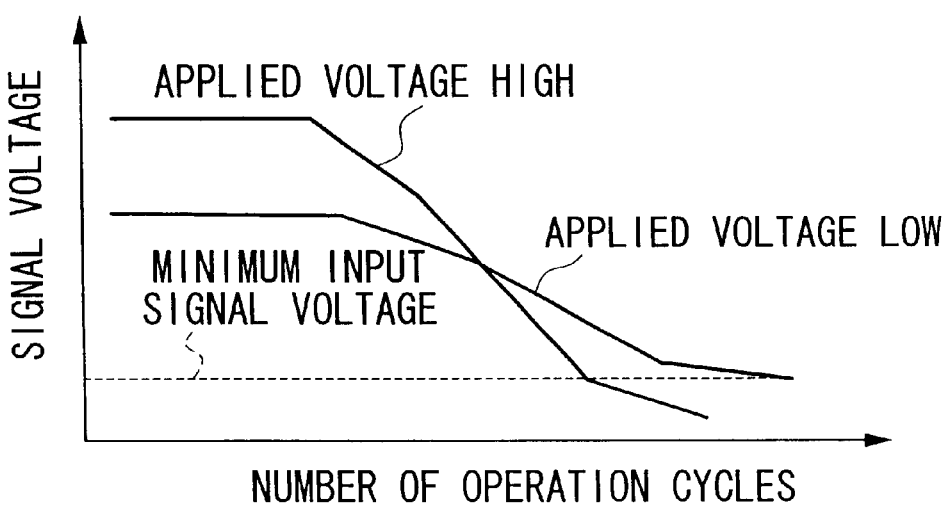
FIG. 7 is a graph showing the variation of the signal voltage in accordance with the number of operation cycles for various cases.
Figure 8:
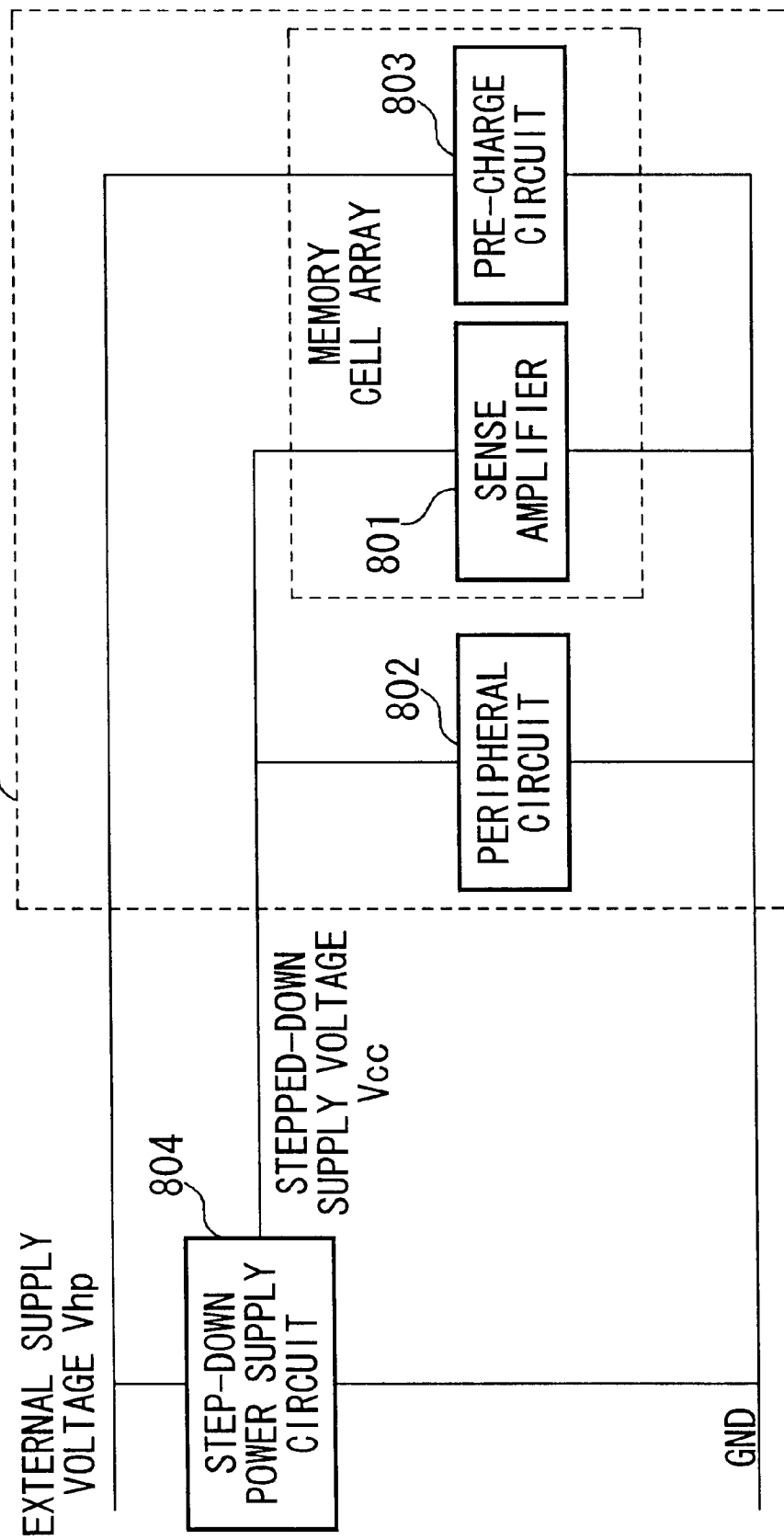
FIG. 8 is a block diagram of a conventional ferroelectric memory device.
Figure 9:
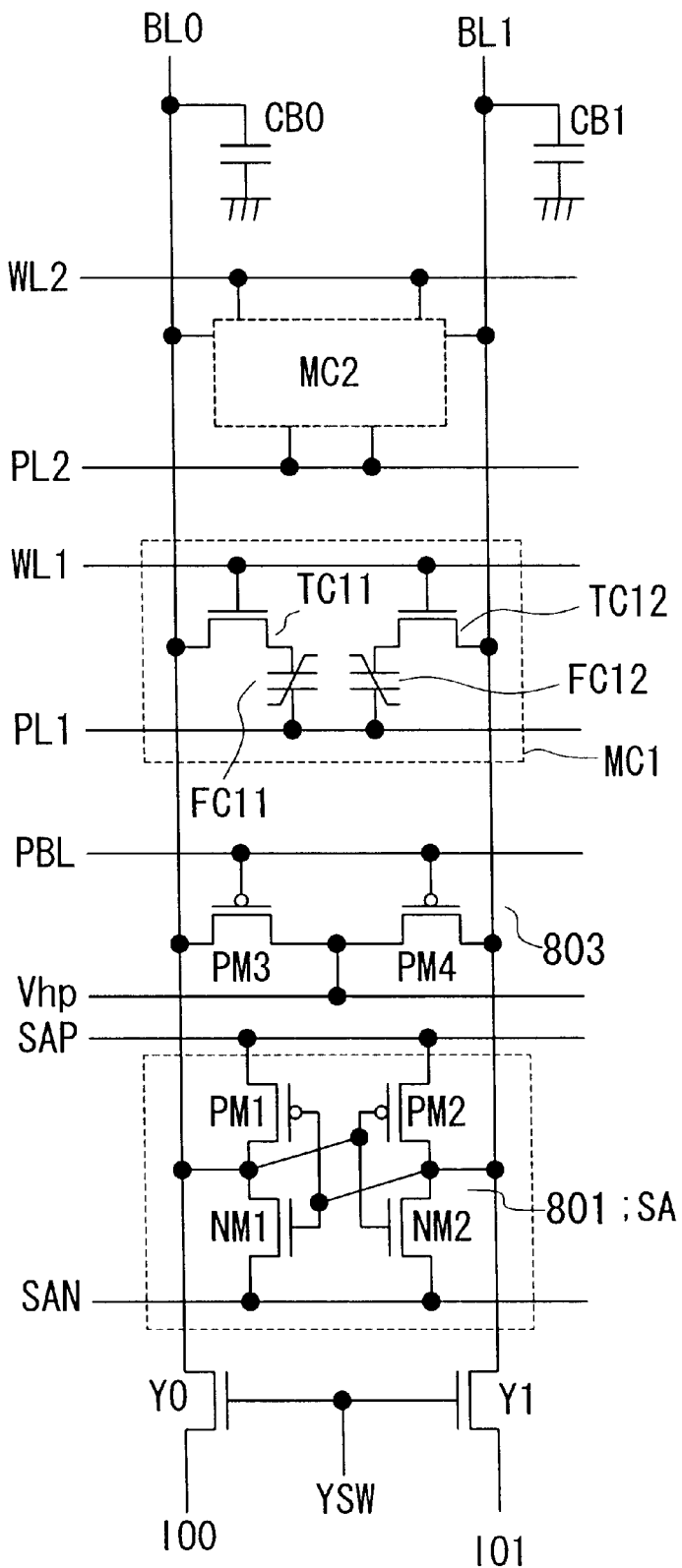
FIG. 9 is a circuit diagram of the conventional ferroelectric memory device.
Figure 10:
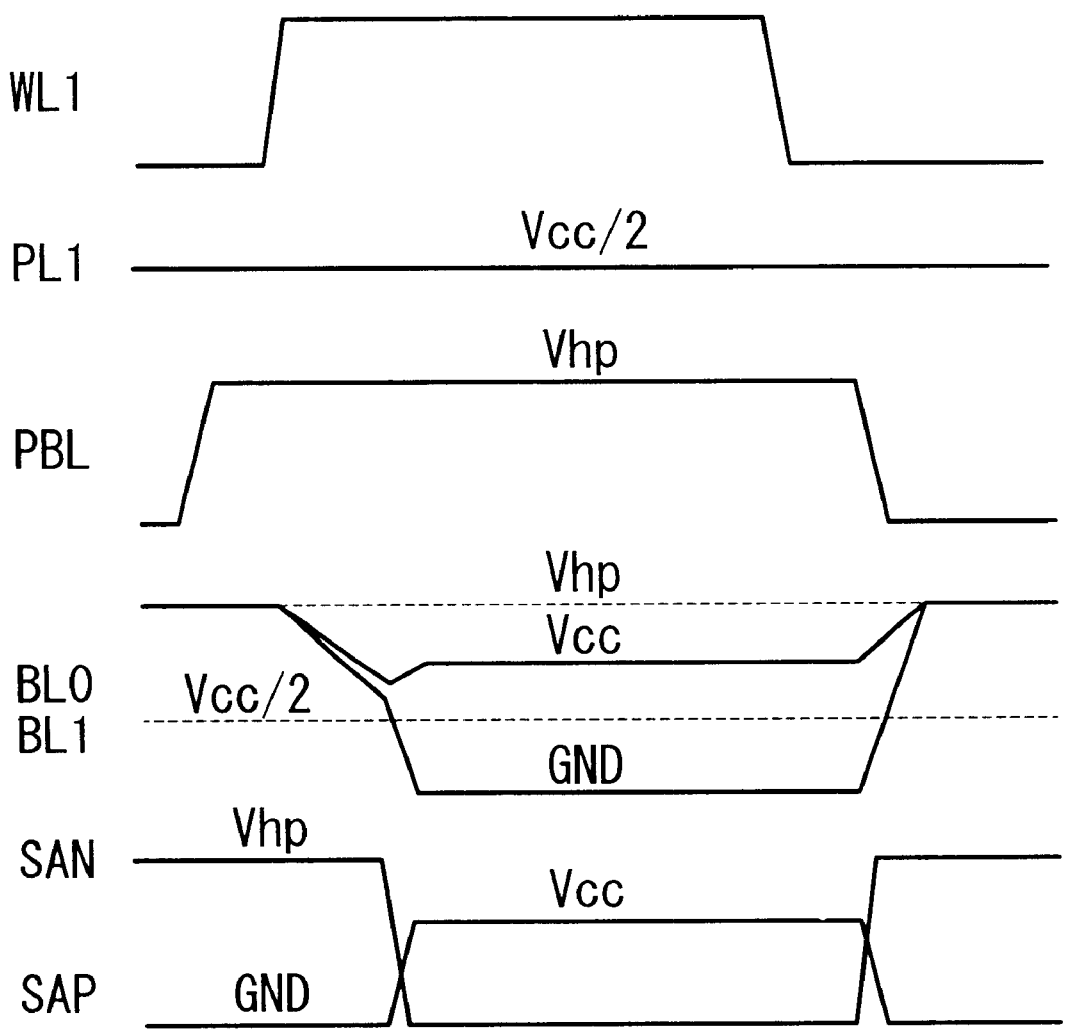
FIG. 10 is a timing diagram of various signals in the conventional ferroelectric memory device.

FIG. 7 shows the characteristics shown in FIG. 6 by replacing each read-out bit-line voltage with a difference between the read-out voltages on the two bit lines connected to the sense amplifier (i.e., a signal voltage).

As shown in FIG. 7, as the applied voltage becomes smaller, the number of operation cycles in which reading can be carried out increases. In this case, although the signal voltage becomes small, a correct reading operation can be achieved if the signal voltage is not less than the minimum allowable input signal voltage of the amplifier.

The above discussion can also apply to the imprinting phenomenon. Similar to the case of fatigue, it was found in the research that the number of possible operation cycles will increase when the applied voltage is made smaller.

The present invention was made based upon the above-described recognition and is arranged such that the external supply voltage VDD is stepped down by a step-down circuit to make the voltage VINT applied to the ferroelectrics lower than the operation voltage of the peripheral circuit but equal to or higher than the coercive voltage of the ferroelectrics to thereby increase the permitted number of read/write operation cycles of the ferroelectric memory and to enhance its reliability.

In a preferred embodiment of the invention, as means (see FIG. 2 at 106) for applying a second supply voltage VINT obtained by stepping down the external supply voltage VDD and the ground potential to a first and a second electrode of a ferroelectric capacitor, a plate-line voltage supply circuit (PLD), a word-line voltage supply circuit (WLD) and a sense amplifier drive circuit (SAD) are provided. The plate-line voltage supply circuit (PLD) is constructed so as to supply the plate line with a voltage ranging from the ground potential to the second supply voltage VINT. The word-line voltage supply circuit (WLD) is constructed so as to supply the word line with a voltage ranging from the ground potential to a voltage Vboot which is equal to or greater than the sum of the ground potential and a threshold voltage of the memory cell transistor. The sense amplifier drive circuit (SAD) is constructed so as to supply the sense amplifier with a voltage ranging from the ground potential to the second supply voltage VINT.

Figure 1:
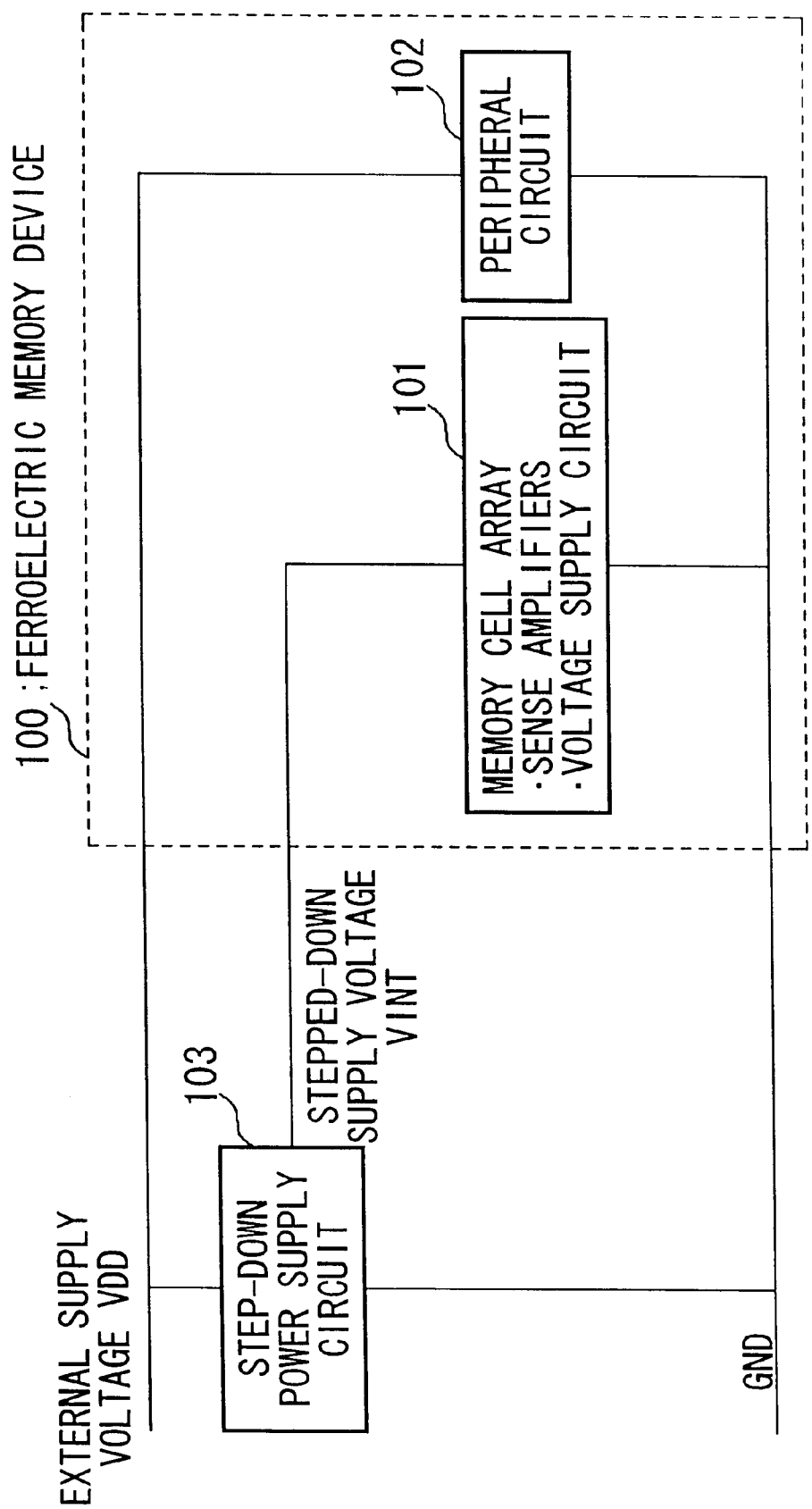
FIG. 1 is a block diagram of a first embodiment of the present invention.

Embodiments of the present invention will now be described in detail with reference to the accompanying drawings. FIG. 1 shows the basic circuit structure of a non-volatile semiconductor memory device provided in accordance with a first embodiment of the invention.

Referring to FIG. 1, a step-down power supply circuit 103 generates from an external supply voltage VDD a stepped-down supply voltage VINT to be applied to ferroelectrics. The external supply voltage VDD is a supply voltage for interfacing the device to the outside and takes a value of 5 volts or 3.3 volts. The stepped-down supply voltage VINT is a voltage which is sufficient to cause the polarization of a ferroelectric capacitor to be reversed and can increase the permitted number of its operation cycles. The voltage VINT is 2.5 volts for example.

The coercive voltage VC of the ferroelectric capacitor is not greater than the stepped-down supply voltage VINT.

The stepped-down supply voltage VINT is used as a voltage to be applied to the ferroelectric capacitors, a voltage to be applied to plate and bit lines and a power supply voltage for sense amplifiers. The stepped-down supply voltage VINT is used also as a supply voltage for a control circuit since its value is constant independently of the variation of the external supply voltage VDD and the change of ambient temperature. The external supply voltage VDD is directly used as a supply voltage for other peripheral circuits in this memory device.

Figure 2:
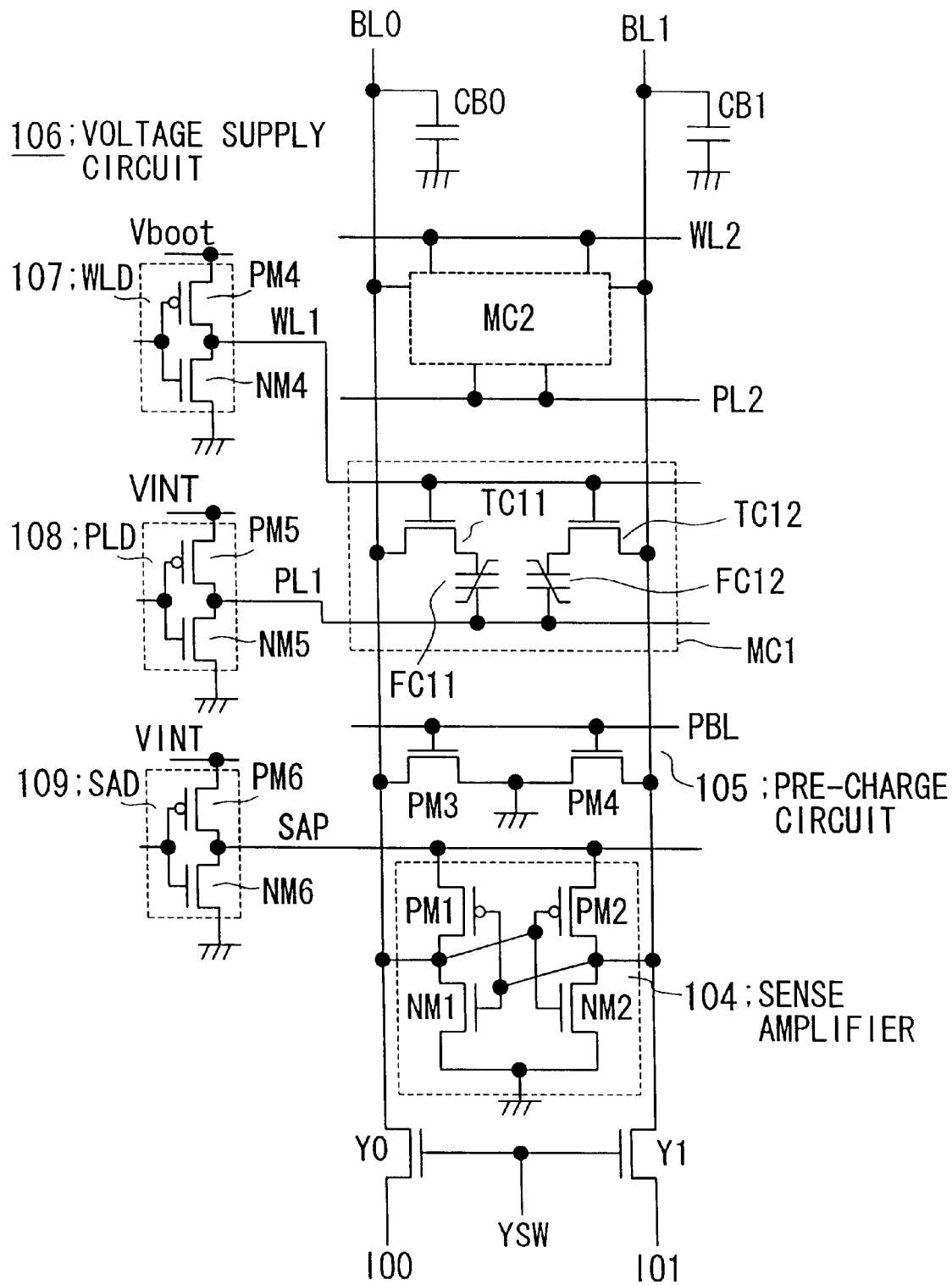
FIG. 2 is a circuit diagram of the first embodiment of the present invention.

FIG. 2 shows in detail a memory cell array, a sense amplifier and a voltage supply circuit 106 for supplying voltages to the memory cell array which together constitute the memory device in accordance with the first embodiment of the invention.

As shown in FIG. 2, two adjacent bit lines BL0 and BL1 have parasitic capacitances CB0 and CB1, respectively, and are connected at one of their ends to a sense amplifier (SA) 104 which is composed of four transistors PM1, PM2, NM1 and NM2. More specifically, the sense amplifier (SA) 104 is of the latch type which comprises first and second inverters whose input and output terminals are cross-coupled to each other and connected respectively to the bit lines BL0 and BL1, wherein the first inverter is comprised of the P-channel MOS transistor PM1 and the N-channel MOS transistor NM1 serially connected between a terminal for a sense amplifier activation signal SAP and the ground (GND) terminal while the second inverter is comprised of the P-channel MOS transistor PM2 and the N-channel MOS transistor NM2 serially connected between the terminal for the signal SAP and the ground (GND) terminal.

A memory cell MC1 is constituted by two ferroelectric capacitors FC11 and FC12 and two cell transistors TC11 and TC12.

One terminal of the ferroelectric capacitors FC11 and FC12 is connected in common to a plate line PL1, and the other terminal of the ferroelectric capacitors FC11 and FC12 is connected to sources of the cell transistors TC11 and TC12, respectively. The gates of the cell transistors TC11 and TC12 are connected in common to a word line WL1, and drains of the cell transistors TC11 and TC12 are connected to the bit lines BL0 and BL1, respectively.

A memory cell MC2 other than the memory cell MC1 has a circuit structure similar to that of the memory cell MC1 and its configuration and element sizes are equivalent to those of MC1.

The plate line PL1 is connected to an output terminal of a plate-line drive circuit (PLD) 108, and the terminal for the sense amplifier activation signal SAP is connected to an output terminal of a sense amplifier drive circuit (SAD) 109. An output stage of each of the plate-line drive circuit (PID) 108 and the sense amplifier drive circuit (SAD) 109 is constituted by a CMOS inverter which comprises a P-channel MOS transistor and an N-channel MOS transistor serially connected between a power supply for these circuits and the ground GND.

The supply voltage for the plate-line drive circuit (PLD) 108 and the sense amplifier drive circuit (SAD) 109 is the stepped-down supply voltage VINT, so that the voltages applied to the plate line PL1 connected to the output terminal of the plate-line drive circuit (PLD) 108 and the voltage applied to a line connected to the output terminal of the sense amplifier drive circuit (SAD) 109 are both equal to the stepped-down supply voltage VINT at most.

The word line WL1 is connected to an output terminal of a word-line drive circuit (WLD) 107. It is necessary for the word line to be supplied with not the stepped-down supply voltage VINT but a voltage Vboot which is a voltage stepped-up by a threshold voltage Vt of the cell transistor, so that the supply voltage for the word-line drive circuit (WLD) 106 is set to the stepped-up voltage Vboot.

The supply voltage Vboot to be applied to the word-line drive circuit (WLD) 107 may be obtained by raising the stepped-down voltage VINT with a not-shown step-up circuit, but if the external supply voltage VDD is higher than the voltage VINT by at least the threshold voltage Vt, this external supply VDD voltage can directly be used as the voltage Vboot.

The supply voltage Vboot is also used for defining the high level of other control signals for the memory cell array such as a pre-charge signal PBL to be applied to gates of MOS transistors PM3 and PM4 constituting a pre-charge circuit 105 and a column selection signal YSW to be applied to gates of column switches Y0 and Y1.

Figure 3:
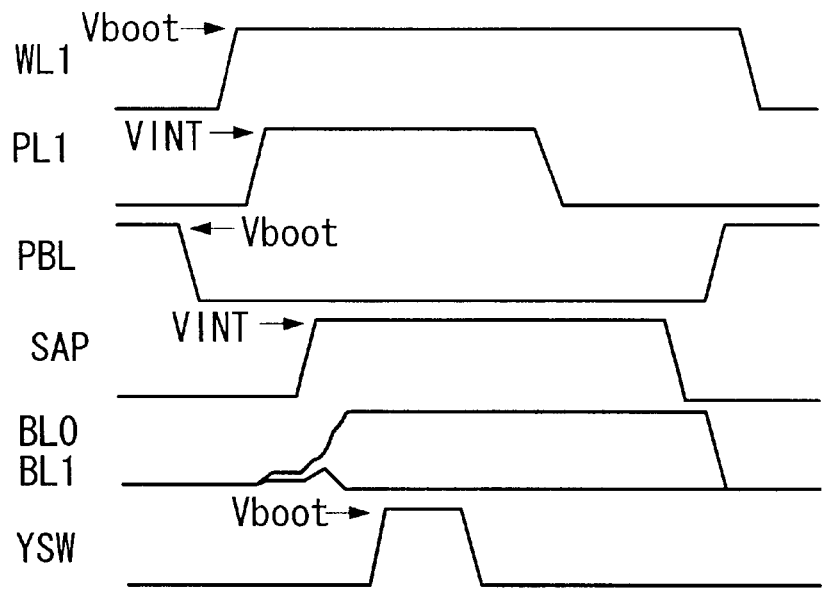
FIG. 3 is a timing diagram of various signals in the first embodiment of the present invention.
Figure 5:
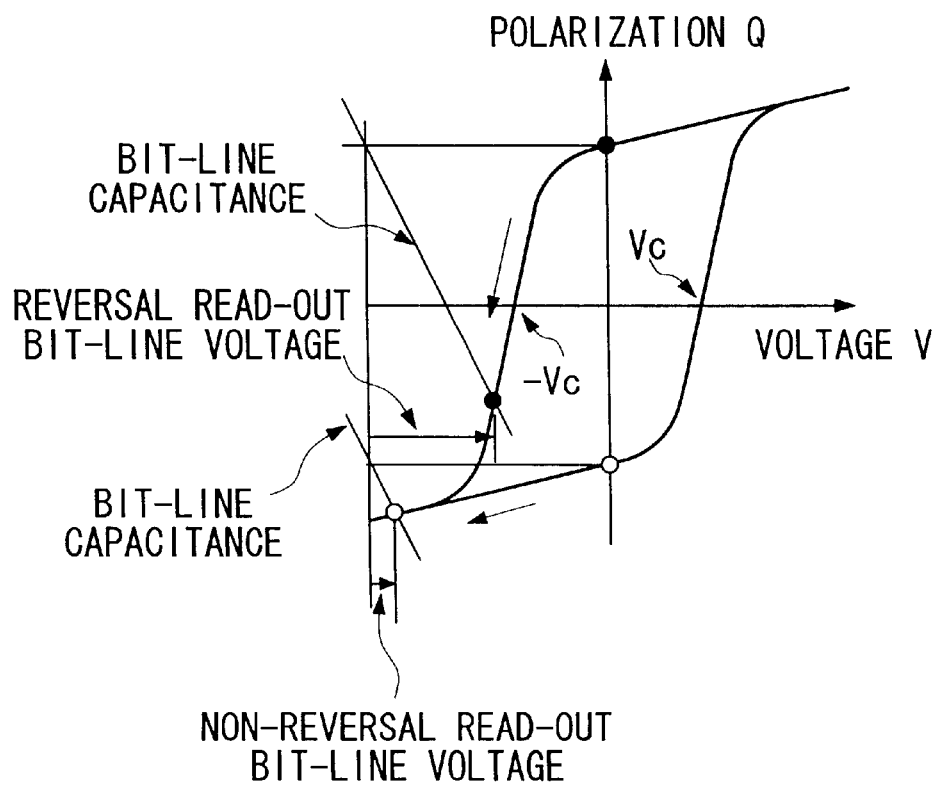
FIG. 5 is an illustration showing the hysteresis of ferroelectrics.

FIG. 3 is a timing diagram of the signals in the circuit of FIG. 2, wherein waveforms of the signals on the word line WL1 and the plate line PL1, the pre-charge signal PBL, the sense amplifier activation signal SAP, the signals on the bit lines BL0 and BL1 and the column selection signal YSW are shown.

The bit lines BL0 and BL1 are pre-charged to the ground (GND) level during the time when the pre-charge signal PBL is at the stepped-up voltage Vboot.

Then, the word line WL1 is brought to the stepped-up voltage Vboot, whereby those memory cells connected to the word line WL1 are selected.

Subsequently, the voltage of the plate line PL1 is changed from the ground level to the stepped-down supply voltage VINT so that a voltage is applied to each of the ferroelectric capacitors FC1 and FC2, whereupon read-out bit-line voltages corresponding to the data of "0" or "1" develop on the bit lines BL0 and BL1.

In this embodiment, the bit-line voltage on the side for which the ferroelectric capacitor is read with a reversal of polarization is higher than that on the side for which the ferroelectric capacitor is read without a reversal of polarization.

In this case, since charge sharing will occur between the parasitic capacitances CB0 and CB1 of the bit lines and the ferroelectric capacitors FC11 and FC12, the voltage applied between the electrodes of each ferroelectric capacitor (i.e., the voltage across each ferroelectric capacitor) is not greater than the stepped-down supply voltage VINT.

In the next step, the sense amplifier activation signal SAP is brought to the stepped-down supply voltage VINT to activate the sense amplifier (SA) 104, as a result of which the difference between the read-out bit-line voltages (i.e., a signal voltage) is amplified and detected as data.

Subsequently, the column selection signal YSW is rendered equal to the stepped-up voltage Vboot to cause the column switches Y0 and Y1 to conduct so that the read-out data is supplied through the I/O bus IO0, IO1 to the outside, whereafter the plate line PL1 is brought to the ground (GND) level to rewrite the data into that ferroelectric capacitor of the memory cell from which that data was read.

Lastly, the bit lines BL0 and BL1 are discharged to the GND level and then the word line WL1 is returned to the GND level, whereupon the read cycle is completed.

The signals on the respective signal lines of FIG. 2 in a write cycle have the same waveforms as those in the read cycle except that data from the I/O bus is written onto the bit lines BL0 and BL1 through the column switches Y0 and Y1 which are rendered ON by the column selection signal YSW.

Thus, according to this embodiment the voltage applied between the electrodes of each ferroelectric capacitor (i.e., the voltage across each capacitor) is equal to the stepped-down supply voltage VINT at the maximum, so that the permitted number of operation cycles of the ferroelectrics can be increased and the reliability of the ferroelectric memory device can be enhanced.

Although the present invention has been described in the above embodiment for the case where the ferroelectric memory device uses memory cells each constructed by two transistors and two capacitors, the present invention can equally be applied to a ferroelectric memory device which uses memory cells each constituted by a single transistor and a single capacitor.

Figure 4:
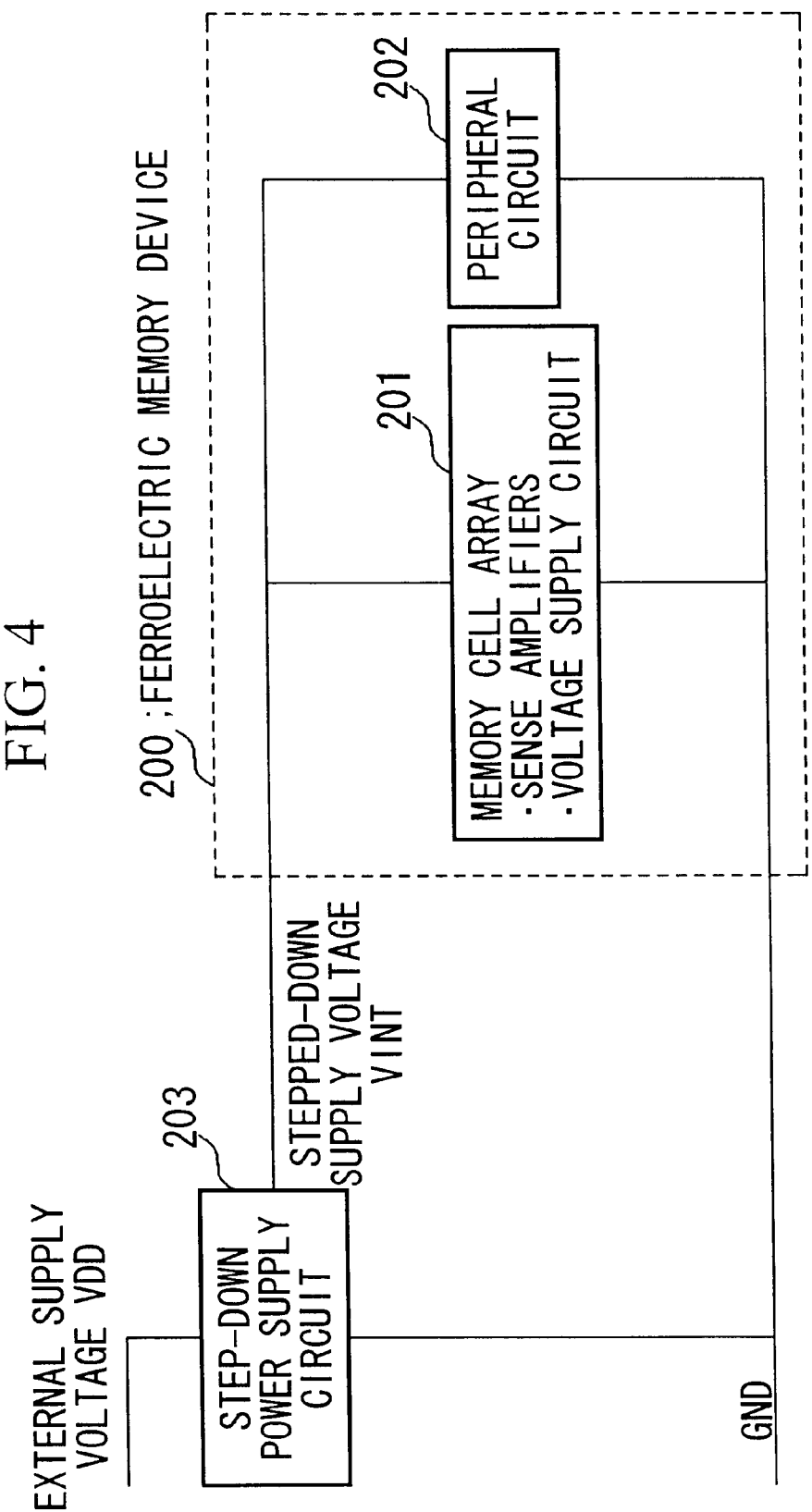
FIG. 4 is a block diagram of a second embodiment of the present invention.

FIG. 4 shows the structure of a second embodiment of the present invention. As shown in FIG. 4, the second embodiment of the invention has the same structure as the above-described first embodiment except that all the parts of the ferroelectric memory device 200 including its peripheral circuit 202 are supplied with the stepped-down supply voltage VINT as their supply voltages.

According to this second embodiment, in addition to the effect that the permitted number of operation cycles of the ferroelectrics is increased, another effect that no alteration of the external supply voltage is needed even when the internal supply voltage should be reduced due to the reduction in size of the accompanying transistors can-be obtained.

The second embodiment of the invention has a further advantageous effect that the power consumption of the circuits as a whole is decreased by virtue of the reduced supply voltage.

It will be appreciated that the structure of the second embodiment can be applied not only to a ferroelectric memory device with two-transistor and two-capacitor type memory cells but also to a ferroelectric memory device with one-transistor and one-capacitor type memory cells.

What is claimed is:

1. A ferroelectric memory device comprising:
a memory cell array which comprises:
a plurality of memory cells arranged in rows and columns, each memory cell including a capacitor element formed by first and second capacitor electrodes with a ferroelectric film sandwiched therebetween for storing information in accordance with polarization states of said ferroelectric film and a transistor having a source and a drain, one of which is connected to one of the first and second capacitor electrodes of said capacitor element;
a plurality of word lines provided for each row of the memory cell array and connected to a gate of each transistor of the memory cells included in the row;
a plurality of plate-lines connected to the other of the first and second capacitor electrodes of each of said capacitor elements in said plurality of memory cells; and
a plurality of bit lines provided for each column of the memory cell array and connected to the other of the source and the drain of each transistor of the memory cells included in the column;
a plurality of sense amplifiers connected to said bit lines;
a generating section for generating, from a first supply voltage fed from the outside, a second supply voltage which is lower than said first supply voltage; and
a supplying section for supplying said first and second electrodes of each capacitor element with said second supply voltage and the ground potential, said second supply voltage being supplied to both said plate lines and said bit lines,
wherein said second supply voltage determines a logical amplitude of said bit lines.

2. A ferroelectric memory device according to claim 1, wherein a voltage difference between said second supply voltage and said ground potential is equal to or greater than a coercive voltage of the ferroelectrics of said ferroelectric film.

3. A ferroelectric memory device according to claim 1, wherein a voltage difference between said second supply voltage and said ground potential corresponds to a minimum voltage difference with which writing of information to and reading of information from said capacitor element can be achieved.

4. A ferroelectric memory device according to claim 1, wherein said generating section comprises a step-down power supply circuit.

5. A ferroelectric memory device according to claim 1, wherein said supplying section comprises a plate-line voltage supply circuit for supplying said plate lines with a voltage ranging from said ground potential to said second supply voltage, a word-line voltage supply circuit for supplying each word line with a voltage ranging from said ground potential to said second supply voltage and a sense amplifier drive circuit for supplying said sense amplifiers with a voltage ranging from said ground potential to said second supply voltage.

6. A ferroelectric memory device according to claim 5, wherein a supply voltage for said plate-line voltage supply circuit corresponds to a voltage difference between said second supply voltage and said ground potential.

7. A ferroelectric memory device according to claim 5, wherein a supply voltage for said word-line voltage supply circuit corresponds to a voltage difference between said first supply voltage and said ground potential.

8. A ferroelectric memory device according to claim 5, wherein a supply voltage for said word-line voltage supply circuit corresponds to a voltage difference between a voltage, obtained by adding a threshold voltage of the transistor of said memory cell to said second supply voltage, and said ground potential.

9. A ferroelectric memory device according to claim 5, wherein a supply voltage for said sense amplifier drive circuit corresponds to a voltage difference between said second supply voltage and said ground potential.

10. A ferroelectric memory device according to claim 1, wherein said device is arranged such that a voltage applied across a ferroelectric capacitor in each memory cell during its reading and writing operations is equal to said second supply voltage at the maximum in accordance with said second supply voltage which is lower than said first supply voltage fed from the outside.

11. A ferroelectric memory device comprising a step-down power supply circuit for stepping down an external supply voltage, a stepped-down supply voltage obtained by said step-down power supply circuit being supplied to plate and bit lines, as a voltage to be applied to a ferroelectric capacitor in each memory cell of a memory cell array, and applied to sense amplifiers as their supply voltage, said device being arranged such that the voltage across said ferroelectric capacitor interposed between a drain or a source of a transistor in each memory cell and a corresponding plate line is equal to said stepped-down supply voltage at the maximum.

12. A ferroelectric memory device according to claim 11, wherein a circuit for driving said word lines to select a row of memory cells in said memory cell array is supplied, as its supply voltage, with a stepped-up voltage which is higher than said stepped-down supply voltage by more than threshold voltage of s aid transistor or with said external supply voltage, and where in said stepped-up voltage or said external supply voltage is used as a voltage which defines the high level of a pre-charge signal to be supplied as a control signal to a circuit for pre-charging the bit lines and the high level of a column switch signal for selecting a column of memory cells in said memory cell array.

13. A ferroelectric memory device according to claim 11, wherein a peripheral circuit in said device is supplied, as its supply voltage, directly with said external supply voltage or with d stepped-down supply voltage.

* * * * *